(12) United States Patent
Kouchi et al.

(10) Patent No.: US 6,292,500 B1
(45) Date of Patent: Sep. 18, 2001

(54) SEMICONDUCTOR LASER DEVICE

(75) Inventors: Yasuyuki Kouchi, Osaka; Hideyuki Nakanishi, Shiga; Masaaki Yuri, Osaka; Akio Yoshikawa, Kyoto; Hisanori Ishiguro, Shiga, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/292,013

(22) Filed: Apr. 15, 1999

(30) Foreign Application Priority Data

Apr. 23, 1998 (JP) ................................................ 10-113160
Feb. 25, 1999 (JP) ................................................ 11-047609

(51) Int. Cl.$^7$ .................................................... H01S 3/00
(52) U.S. Cl. ............................................................ 372/38
(58) Field of Search ............................ 372/109, 50, 38; 257/390, 635, 258; 437/42

(56) References Cited

U.S. PATENT DOCUMENTS

| | | | | |
|---|---|---|---|---|
| 5,514,989 | * | 5/1996 | Sato et al. | 372/109 |
| 5,521,107 | * | 5/1996 | Yamazaki et al. | 437/42 |
| 5,583,369 | * | 12/1996 | Yamazaki et al. | 257/635 |
| 5,663,589 | * | 9/1997 | Saitoh et al. | 257/390 |
| 6,005,266 | * | 12/1999 | Forrest et al. | 257/258 |

FOREIGN PATENT DOCUMENTS

| | | |
|---|---|---|
| 0 311 279 | 4/1989 | (EP) . |
| 51-021153 | 2/1976 | (JP) . |
| 52-098956 | 8/1977 | (JP) . |
| 54-140482 | 10/1979 | (JP) . |
| 58-162085 | 9/1983 | (JP) . |
| 58-165388 | 9/1983 | (JP) . |
| 60-086036 | 6/1985 | (JP) . |
| 61-022364 | 2/1986 | (JP) . |
| 63-048885 | 3/1988 | (JP) . |
| 03-151679 | 6/1991 | (JP) . |
| 6-021887 | 1/1994 | (JP) . |
| 06-085249 | 3/1994 | (JP) . |

OTHER PUBLICATIONS

Australian Patent Office, Search Report, Jul. 13, 2000, 4 sheets,.

Australian Patent Office, Examination Report, Jul. 13, 2000, 4 sheets,.

* cited by examiner

*Primary Examiner*—Leon Scott, Jr.
(74) *Attorney, Agent, or Firm*—Eric J. Robinson; Nixon Peabody LLP (57) ABSTRACT

A semiconductor laser device of the present invention includes: a semiconductor laser chip including an anode and a cathode; and a field effect transistor. The anode of the semiconductor laser chip is connected to the drain of the field effect transistor. The gate of the field effect transistor is connected to the drain of the field effect transistor. And the cathode of the semiconductor laser chip is connected to the source of the field effect transistor.

10 Claims, 8 Drawing Sheets

SEMICONDUCTOR LASER DEVICE

BACKGROUND OF THE INVENTION

The present invention relates to a semiconductor laser device including a semiconductor laser chip.

A semiconductor laser device provides an optical output by operating a semiconductor laser chip with the application of a forward bias thereto. However, if a surge voltage has been applied to the semiconductor laser chip, then an excessive amount of surge current flows through the semiconductor laser chip in the forward direction, resulting in an excessive optical output. Consequently, the performance of the semiconductor laser chip itself deteriorates.

First, a conventional surge-suppressive semiconductor laser device will be described with reference to FIGS. 8(a) and 8(b).

Figure 8A:
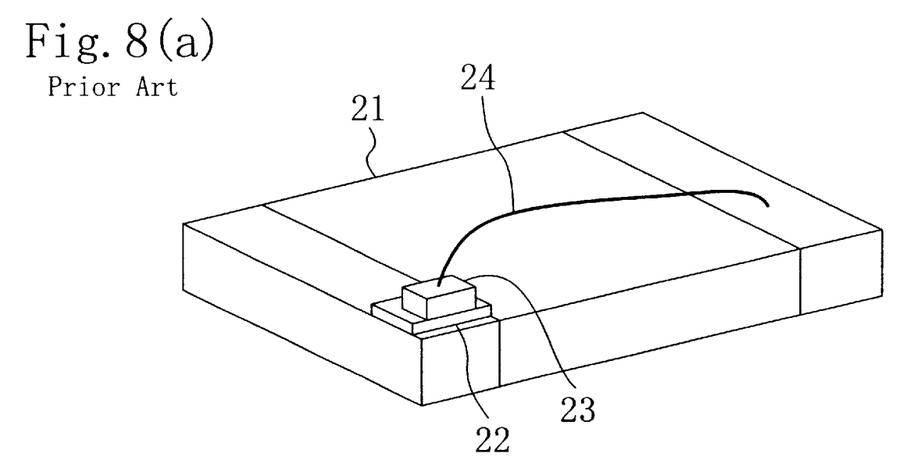
FIG. 8(a) is a perspective view of a conventional semiconductor laser device.

FIG. 8(a) is perspective view of a conventional semiconductor laser device. As shown in FIG. 8(a), a semiconductor laser chip 23, made of GaAlAs, is formed over a ceramic capacitor 21 with a laser mount 22 interposed therebetween. The ceramic capacitor 21 is connected in parallel to the semiconductor laser chip 23 via a wire 24.

Figure 8B:
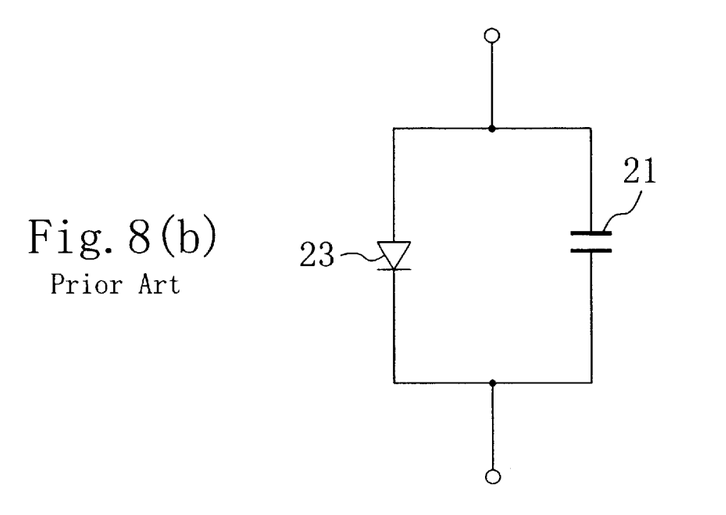
FIG. 8(b) is a circuit diagram of the conventional semiconductor laser device.

FIG. 8(b) is circuit diagram of the conventional semiconductor laser device. As shown in FIG. 8(b), the semiconductor laser chip 23 and the ceramic capacitor 21 are connected in parallel to each other. When a surge voltage is applied to the semiconductor laser device, the ceramic capacitor 21 absorbs a surge current, which is a transient current, thus preventing an excessive amount of current from being supplied to the semiconductor laser chip 23. Also, if the impedance of the ceramic capacitor 21 is made sufficiently smaller than that of the semiconductor laser chip 23 by increasing the capacitance of the ceramic capacitor 21, then the surge current can be absorbed even more effectively.

In the conventional semiconductor laser device, in order to absorb the surge current sufficiently, the impedance of the ceramic capacitor 21 should be smaller than that of the semiconductor laser chip 23. Thus, the capacitance of the ceramic capacitor 21 should be set larger than the junction capacitance of the semiconductor laser chip 23.

However, suppose a reference voltage, applied to a laser driver for driving the semiconductor laser chip 23, fluctuates; the semiconductor laser chip 23 is superimposed with a radio frequency voltage; or a pulse voltage is applied to the semiconductor laser chip 23 when the capacitance of the ceramic capacitor 21 is larger than the junction capacitance of the semiconductor laser chip 23. In each of these situations, radio frequency components leak to the ceramic capacitor 21 connected in parallel to the semiconductor laser chip 23. As a result, the response characteristics of the semiconductor laser chip 23 adversely deteriorate.

SUMMARY OF THE INVENTION

An object of the present invention is providing a surge-suppressive semiconductor laser device exhibiting excellent response characteristics even if a radio frequency voltage has been superimposed or if the device is modulated with pulses.

In order to achieve this object, a first exemplary semiconductor laser device according to the present invention includes: a semiconductor laser chip including an anode and a cathode; and a field effect transistor. The anode is connected to the drain of the field effect transistor. The gate of the field effect transistor is connected to the drain of the field effect transistor. And the cathode is connected to the source of the field effect transistor.

In the first semiconductor laser device, when a voltage exceeding a threshold voltage of the field effect transistor is applied to the semiconductor laser chip, a surge current flows through, and can be absorbed by, the field effect transistor. Also, since the field effect transistor starts to operate only when a voltage exceeding the threshold voltage of the field effect transistor is applied to the semiconductor laser chip, the response of the semiconductor laser chip does not deteriorate even if a radio frequency voltage has been superimposed or the device has been modulated with a pulse voltage.

A second exemplary semiconductor laser device according to the present invention includes: a semiconductor laser chip including an anode and a cathode; and a bipolar transistor. The anode is connected to the collector of the bipolar transistor, and the cathode is connected to the emitter of the bipolar transistor.

In the second semiconductor laser device, when a voltage exceeding an avalanche voltage between the collector and the emitter of the bipolar transistor is applied to the semiconductor laser chip, a surge current flows through, and can be absorbed by, the bipolar transistor. Also, the bipolar transistor starts to operate only when a voltage exceeding the avalanche voltage between the collector and emitter of the bipolar transistor is applied to the semiconductor laser chip. Thus, the response of the semiconductor laser chip does not deteriorate even if a radio frequency voltage has been superimposed or the device has been modulated with a pulse voltage.

A third exemplary semiconductor laser device according to the present invention includes: a semiconductor laser chip including an anode and a cathode; a field effect transistor; and a bipolar transistor. The anode is connected to the collector of the bipolar transistor. The cathode is connected to the emitter of the bipolar transistor. The drain of the field effect transistor is connected to the collector of the bipolar transistor. The source of the field effect transistor is connected to the base of the bipolar transistor. And the gate of the field effect transistor is connected to the drain of the field effect transistor.

In the third semiconductor laser device, only when a voltage exceeding a threshold voltage of the field effect transistor is applied to the semiconductor laser chip, the field effect transistor starts to operate. In response thereto, a base current is injected into the bipolar transistor and a surge current flows through, and can be absorbed by, the bipolar transistor. Also, since the field effect transistor starts to operate only when a voltage exceeding the threshold voltage of the field effect transistor is applied to the semiconductor laser chip, the response of the semiconductor laser chip does not deteriorate even if a radio frequency voltage has been superimposed or the device has been modulated with a pulse voltage.

A fourth exemplary semiconductor laser device according to the present invention includes: a semiconductor laser chip including an anode and a cathode; and a surge absorber including a diode and a capacitor that are connected in series to each other. The anode is connected to one terminal of the surge absorber. The cathode is connected to the other terminal of the surge absorber. And the diode is connected to the semiconductor laser chip to have the same polarity.

The fourth semiconductor laser device includes a surge absorber including a diode and a capacitor that are connected in series to each other. Since the bias voltage of the diode is relatively low during the normal operation of the semiconductor laser device, the impedance of the diode is larger than that of the semiconductor laser chip. Thus, it is possible to prevent the modulated components from leaking from the laser chip into the surge absorber even if a radio frequency voltage has been superimposed, for example. As a result, the response characteristics of the semiconductor laser chip do not deteriorate.

A fifth semiconductor laser device according to the present invention includes: a semiconductor laser chip including an anode and a cathode; a first diode including an anode and a cathode; and a second diode including an anode and a cathode. The anodes of the first and second diodes are connected in common. The anode of the semiconductor laser chip is connected to the cathode of the first diode. And the cathode of the semiconductor laser chip is connected to the cathode of the second diode.

In the fifth semiconductor laser device, when a surge voltage is applied to the semiconductor laser device, breakdown happens in the first diode connected to the semiconductor laser chip to have mutually reverse polarities. On the other hand, the second diode, connected to the semiconductor laser chip to have the same polarity, is forward biased. As a result, the surge current can be absorbed. Also, even if a bias voltage varies or a reference voltage, applied to a laser driver, fluctuates due to the superposition of a radio frequency voltage, the bias voltage of the second diode hardly changes. Thus, it is possible to prevent the modulated components from leaking from the laser chip into the surge absorber even if a radio frequency voltage has been superimposed, for example. As a result, the response characteristics of the semiconductor laser chip do not deteriorate.

DESCRIPTION OF THE PREFERRED EMBODIMENTS

Embodiment 1

Figure 1A:
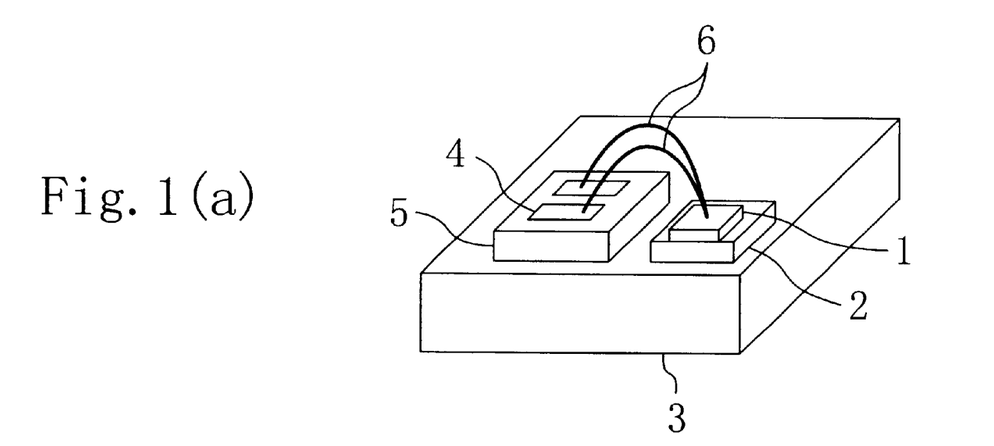
FIG. 1(a) is a perspective view of a semiconductor laser device according to a first embodiment of the present invention.
Figure 1B:
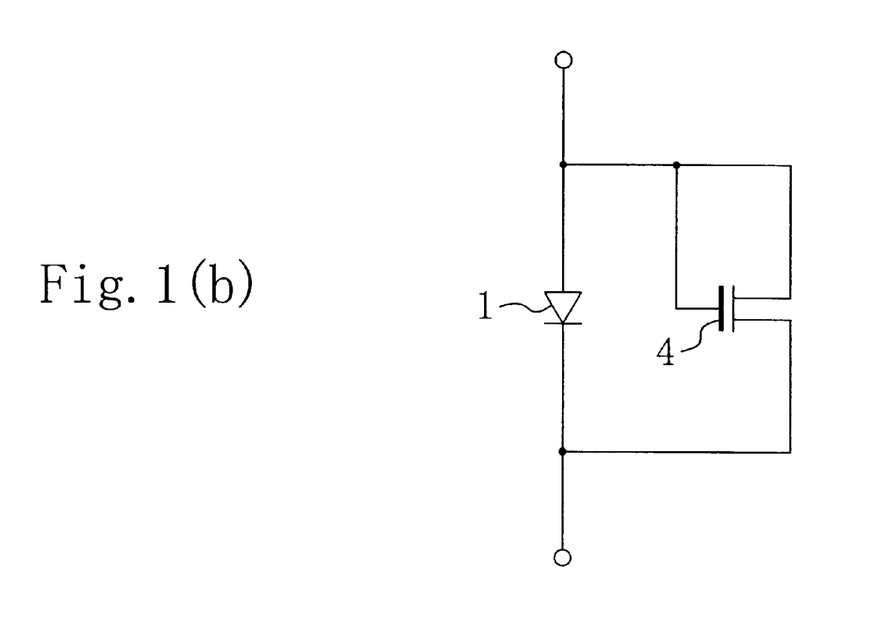
FIG. 1(b) is a circuit diagram of the semiconductor laser device of the first embodiment.

FIG. 1(a) is a perspective view of a semiconductor laser device according to a first exemplary embodiment of the present invention; and FIG. 1(b) is a circuit diagram of the semiconductor laser device of the first embodiment.

As shown in FIG. 1(a), a semiconductor laser chip 1, made of GaAlAs, is provided over a package 3 with a conductive laser mount 2 interposed therebetween. A semiconductor substrate 5, including an n-channel field effect transistor 4 operating in an enhancement mode thereon, is also provided on the package 3. The semiconductor laser chip 1 and the field effect transistor 4 are connected to each other via a wire 6.

As shown in FIG. 1(b), the anode of the semiconductor laser chip 1 is connected to the gate and the drain of the field effect transistor 4, while the cathode of the semiconductor laser chip 1 is connected to the source of the field effect transistor 4.

In this case, a bias voltage of the semiconductor laser chip 1 is ordinarily in the range from 1.5 V to 2.5 V. By setting the threshold voltage of the field effect transistor 4 higher than the bias voltage of the semiconductor laser chip 1, the field effect transistor 4 does not start to operate so long as the semiconductor laser chip 1 operates at the bias voltage. In other words, the field effect transistor 4 does not operate unless a voltage exceeding the threshold voltage of the field effect transistor 4 is applied to the semiconductor laser device. Accordingly, the response of the semiconductor laser chip 1 does not deteriorate even if a radio frequency voltage has been superimposed or the device has been modulated with a pulse voltage.

Next, the results of an experiment, where a surge voltage is applied to the semiconductor laser device of the first embodiment to measure a surge current flowing through the semiconductor laser chip 1, will be described.

Figure 2A:
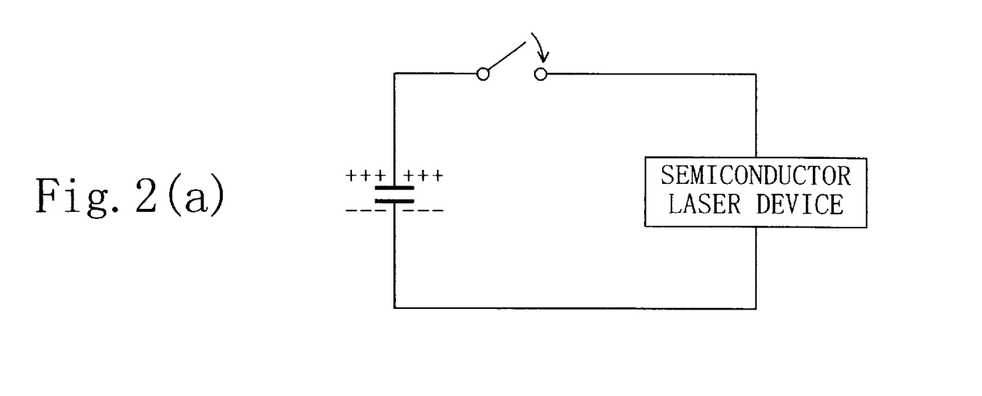
FIG. 2(a) is a circuit diagram illustrating a circuit for applying a surge voltage to the semiconductor laser device of the first embodiment to test the device.

FIG. 2(a) illustrates a circuit for applying a surge voltage to the semiconductor laser device. This circuit includes a capacitor with a capacitance of 200 pF and a switch. When the switch is turned ON, electrical charges, which have been stored in the capacitor, start to flow into the semiconductor laser device.

Figure 2B:
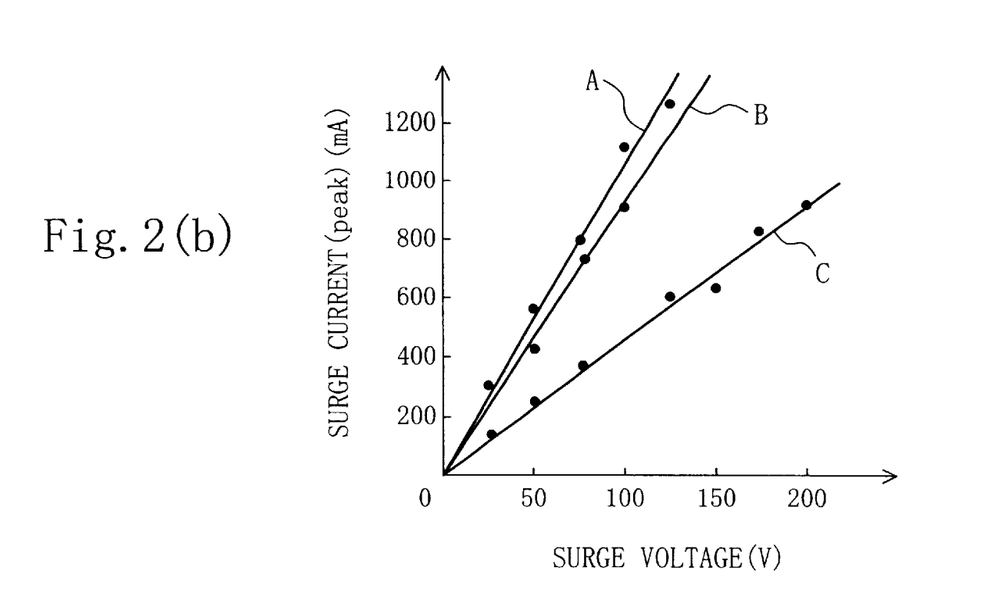
FIG. 2(b) is a graph illustrating a relationship between a surge voltage and a surge current flowing through the semiconductor laser chip in the semiconductor laser device of the first embodiment.

FIG. 2(b) illustrates a relationship between a surge voltage applied to the semiconductor laser device and (the peak value of) a surge current flowing through the semiconductor laser chip 1. In FIG. 2(b), the line A represents a surge current flowing through the semiconductor laser chip 1 where the semiconductor laser device includes only the semiconductor laser chip 1. The line B illustrates a surge current flowing through the semiconductor laser chip 1 where the threshold voltage of the field effect transistor 4 is 10 V. And the line C illustrates a surge current flowing through the semiconductor laser chip 1 where the threshold voltage of the field effect transistor 4 is 3 V.

Setting the threshold voltage of the field effect transistor 4 at 10 V, when a surge voltage exceeding 10 V is applied to the semiconductor laser device, a voltage applied to the transistor 4 exceeds the threshold voltage thereof. As a result, a surge current flows through the transistor 4. Thus, as compared with a semiconductor laser device including only the semiconductor laser chip 1, the surge current flowing into the semiconductor laser chip 1 can be reduced.

If the threshold voltage of the field effect transistor 4 is lowered to 3 V, then a surge current flows through the transistor 4 only by applying a surge voltage exceeding 3 V to the semiconductor laser device. As a result, the surge current can be absorbed even more effectively.

The threshold voltage of the field effect transistor 4 should preferably be in the range from 0.2 V to 5.0 V and higher than the bias voltage of the semiconductor laser chip 1. The reason is as follows. If the threshold voltage of the field effect transistor 4 is lower than 5 V, then the surge current would be absorbed more effectively. This is because the lower the threshold voltage is, the faster the field effect transistor 4 can respond to the rise of the surge voltage. However, as the threshold voltage of the field effect transistor 4 is closer to the bias voltage of the semiconductor laser chip 1, the transistor 4 is more and more likely to operate accidentally. This is because if a radio frequency voltage has been superimposed in such a situation, then the bias voltage varies or the reference voltage, applied to a laser driver, fluctuates easily. Thus, the threshold voltage of the field effect transistor 4 should be higher than the bias voltage of the semiconductor laser chip 1 by at least 0.2 V and preferably more.

In the first embodiment, the field effect transistor 4 does not operate so long as a voltage lower than the threshold voltage of the field effect transistor 4 is applied to the semiconductor laser device. Accordingly, radio frequency components do not leak into the field effect transistor 4. In actuality, when the semiconductor laser device was modulated with pulses, the waveform of a current flowing through the device and the intensity waveform of output optical power thereof exhibited excellent response at the rise and fall times of the pulses.

If the resistance between the drain and source of the field effect transistor 4 is equal to or lower than the series resistance of the semiconductor laser chip 1, then most of the surge current, flowing through the semiconductor laser device, is that flowing through the field effect transistor 4. As a result, the surge current can be absorbed a lot more effectively. Accordingly, the on-resistance between the drain and source of the field effect transistor 4 is preferably 5Ω or less.

Embodiment 2

Figure 3A:
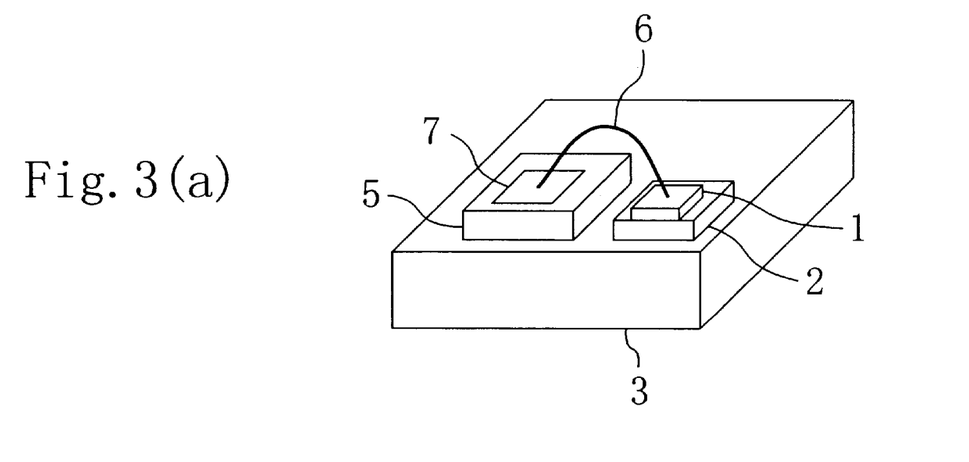
FIG. 3(a) is a perspective view of a semiconductor laser device according to a second embodiment of the present invention.
Figure 3B:
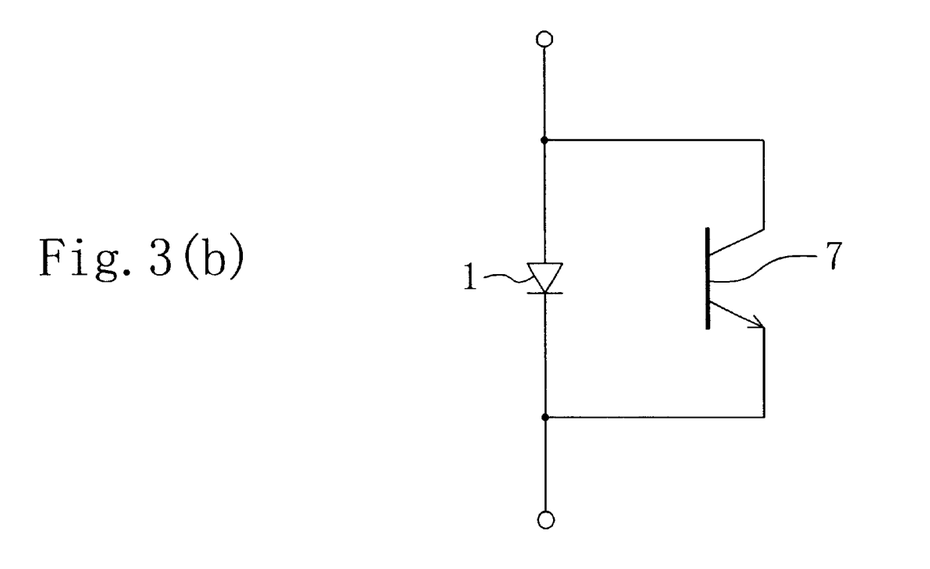
FIG. 3(b) is a circuit diagram of the semiconductor laser device of the second embodiment.

FIG. 3(a) is a perspective view of a semiconductor laser device according to a second embodiment of the present invention; and FIG. 3(b) is a circuit diagram of the semiconductor laser device of the second embodiment.

As shown in FIG. 3(a), a semiconductor laser chip 1, made of GaAlAs, is provided over a package 3 with a conductive laser mount 2 interposed therebetween. A semiconductor substrate 5, including an npn bipolar transistor 7 thereon, is also provided on the package 3. The semiconductor laser chip 1 and the bipolar transistor 7 are connected to each other via a wire 6.

As shown in FIG. 3(b), the anode of the semiconductor laser chip 1 is connected to the collector of the bipolar transistor 7, while the cathode of the semiconductor laser chip 1 is connected to the emitter of the bipolar transistor 7.

By setting an avalanche voltage between the collector and emitter of the bipolar transistor 7 higher than the bias voltage of the semiconductor laser chip 1, the bipolar transistor 7 does not start to operate so long as the semiconductor laser chip 1 operates at the bias voltage. In other words, the bipolar transistor 7 does not operate unless a voltage exceeding the avalanche voltage between the collector and emitter of the bipolar transistor 7 is applied to the semiconductor laser device. Accordingly, the response of the semiconductor laser chip 1 does not deteriorate even if a radio frequency voltage has been superimposed or the device has been modulated with a pulse voltage.

Because of the same reason as that described in the first embodiment, the avalanche voltage between the collector and emitter of the bipolar transistor 7 should preferably be higher than the bias voltage of the semiconductor laser chip 1 by 0.2 V to 5.0 V.

In the second embodiment, the bipolar transistor 7 does not operate so long as a voltage lower than the absolute value of the avalanche voltage between the collector and emitter of the bipolar transistor 7 is applied to the semiconductor laser device. Accordingly, radio frequency components do not leak into the bipolar transistor 7. In actuality, when the semiconductor laser device was modulated with pulses, the waveform of a current flowing through the device and the intensity waveform of output optical power thereof exhibited excellent response at the rise and fall times of the pulses.

Embodiment 3

Figure 4A:
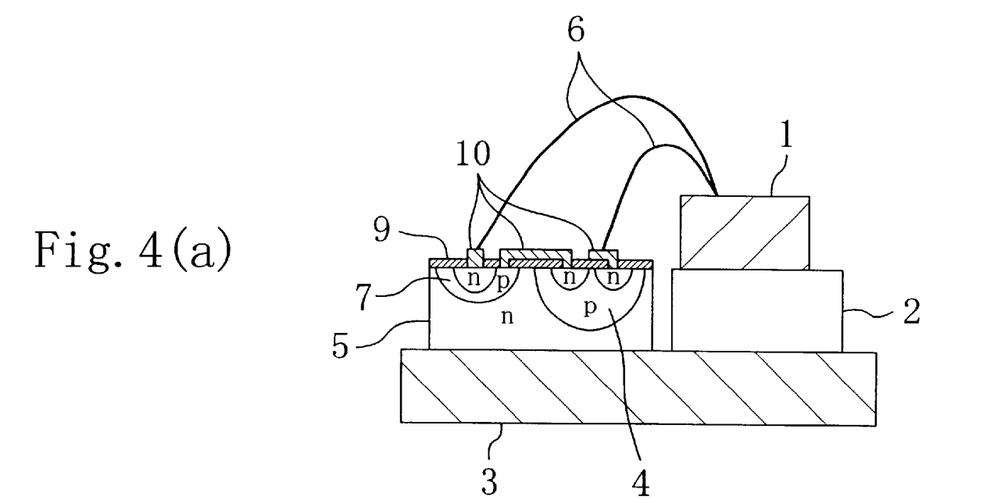
FIG. 4(a) is a cross-sectional view of a semiconductor laser device according to a third embodiment of the present invention.
Figure 4B:
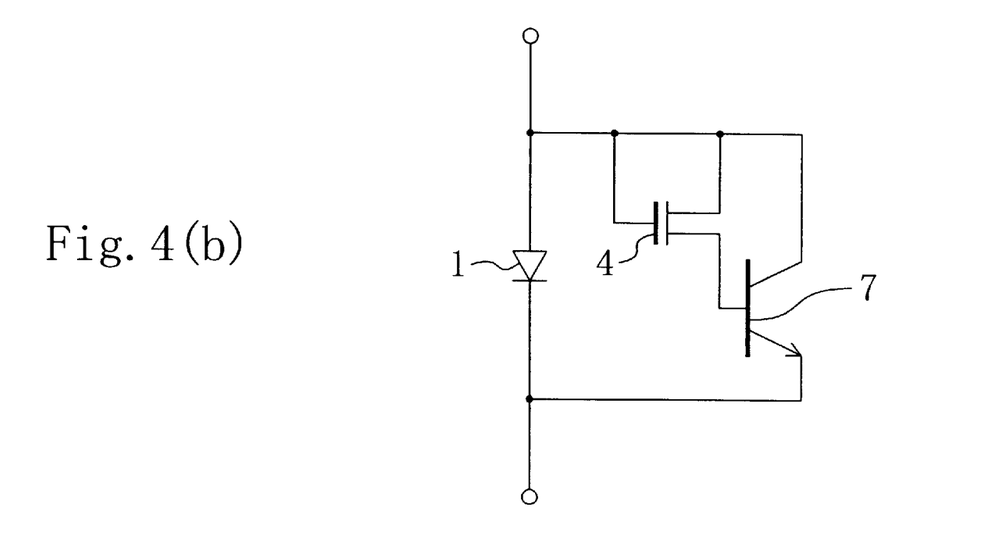
FIG. 4(b) is a circuit diagram of the semiconductor laser device of the third embodiment.

FIG. 4(a) is a cross-sectional view of a semiconductor laser device according to a third embodiment of the present invention; and FIG. 4(b) is a circuit diagram of the semiconductor laser device of the third embodiment.

As shown in FIG. 4(a), a semiconductor laser chip 1, made of GaAlAs, is provided over a package 3 with a conductive laser mount 2 interposed therebetween. A semiconductor substrate 5, including an n-channel field effect transistor 4 operating in an enhancement mode and an npn bipolar transistor 7 thereon, is also provided on the package 3. The semiconductor laser chip 1 is connected to the field effect transistor 4 and to the bipolar transistor 7 by connecting respective wires 6 to associated electrodes 10 formed in the openings of an insulating film 9 on the semiconductor substrate 5.

As shown in FIG. 4(b), the drain and gate of the field effect transistor 4 and the collector of the bipolar transistor 7 are all connected to the anode of the semiconductor laser chip 1. The cathode of the semiconductor laser chip 1 is connected to the emitter of the bipolar transistor 7. The source of the field effect transistor 4 is connected to the base of the bipolar transistor 7. In this case, the bias voltage of the semiconductor laser chip 1 is 2 V, while the threshold voltage of the field effect transistor 4 is 3 V.

When a surge voltage exceeding 3 V is applied to the semiconductor laser device, the field effect transistor 4 starts to operate and a base current is injected to the bipolar transistor 7, which also starts to operate. We confirmed based on the results of experiments that when the surge current flows through the bipolar transistor 7 in this manner, then the surge current supplied to the semiconductor laser device can be absorbed by the transistor 7.

In the third embodiment, the field effect transistor 4 does not operate so long as a voltage lower than the threshold voltage of the field effect transistor 4 is applied to the semiconductor laser device. Accordingly, radio frequency components do not leak into the field effect transistor 4. In actuality, when the semiconductor laser device was modulated with pulses, the waveform of a current flowing through the device and the intensity waveform of output optical power thereof exhibited excellent response at the rise and fall times of the pulses.

Because of the same reason as that described in the first embodiment, the threshold voltage of the field effect transistor 4 should preferably be higher than the bias voltage of the semiconductor laser chip 1 by 0.2 V to 5.0 V.

Embodiment 4

Figure 5A:
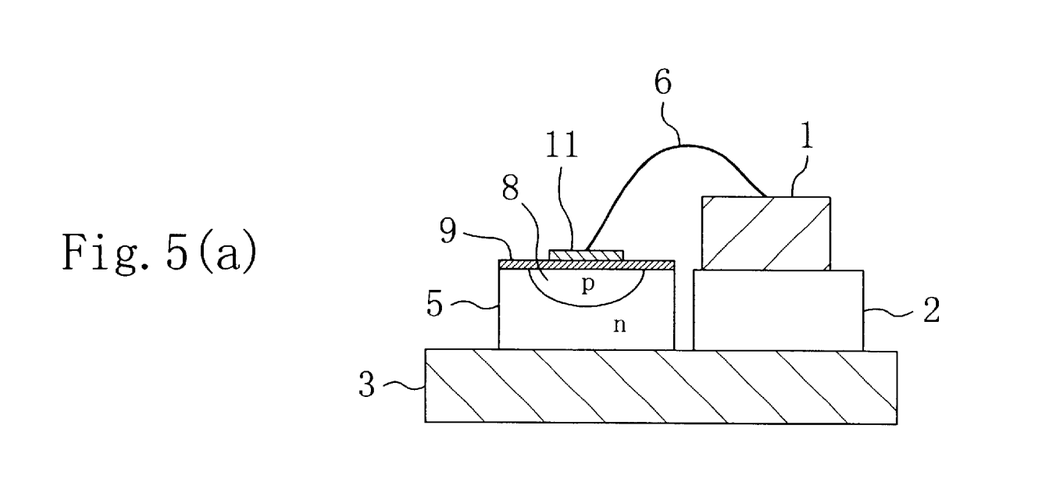
FIG. 5(a) is a cross-sectional view of a semiconductor laser device according to a fourth embodiment of the present invention.
Figure 5B:
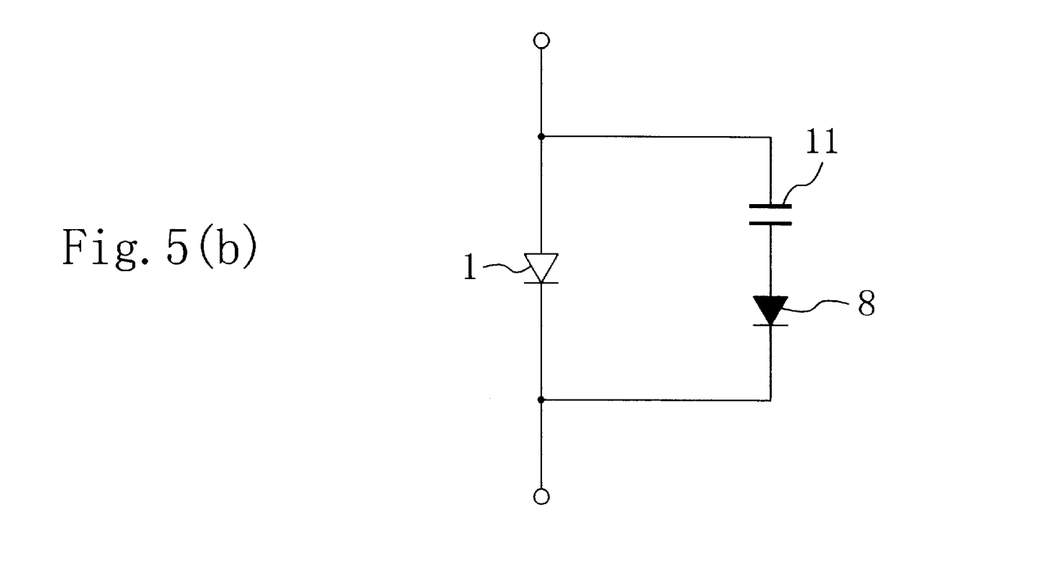
FIG. 5(b) is a circuit diagram of the semiconductor laser device of the fourth embodiment.

FIG. 5(a) is a cross-sectional view of a semiconductor laser device according to a fourth embodiment of the present invention; and FIG. 5(b) is a circuit diagram of the semiconductor laser device of the fourth embodiment.

As shown in FIG. 5(a), a semiconductor laser chip 1, made of GaAlAs, is provided over a package 3 with a conductive laser mount 2 interposed therebetween. A semiconductor substrate 5, including a diode 8 and a capacitor 11 thereon, is also provided on the package 3. The diode 8 and the capacitor 11 are electrically isolated from each other via an insulating film 9.

As shown in FIG. 5(b), the diode 8 and the capacitor 11, connected in series to each other, form a surge absorber. The anode of the semiconductor laser chip 1 is connected to the capacitor 11, i.e., one terminal of the surge absorber, while the cathode of the semiconductor laser chip 1 is connected to the cathode of the diode 8, i.e., the other terminal of the surge absorber.

When a surge voltage is applied to the semiconductor laser device, a surge current flows through the diode 8 by way of the capacitor 11. As a result, the surge current, supplied to the semiconductor laser device, can be absorbed by the surge absorber.

It should be noted that if the capacitance of the capacitor 11 is increased to decrease the impedance of the surge absorber, then the surge current could be absorbed even more effectively. Also, since the bias voltage is likely to vary or a reference voltage, applied to a laser driver, fluctuates easily if a radio frequency voltage has been superimposed, the bias voltage of the diode 8 is ordinarily 0.2 V or less, which is very small. Since the bias voltage of the diode 8 is that low, the impedance of the diode 8 is larger than that of the semiconductor laser chip 1 during the normal operation of the semiconductor laser device. Accordingly, even if a radio frequency voltage has been superimposed, it is possible to prevent the modulated components from leaking from the laser chip into the surge absorber. Thus, when the semiconductor laser device is modulated with pulses, the waveform of a current flowing through the device and the intensity waveform of output optical power thereof exhibit excellent response at the rise and fall times of the pulses.

Embodiment 5

Figure 6A:
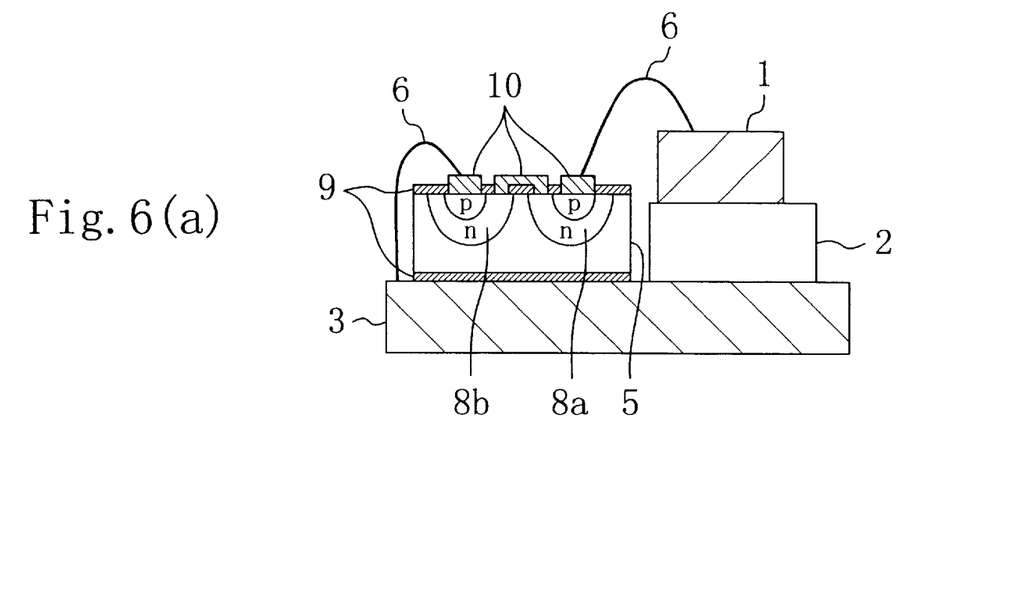
FIG. 6(a) is a cross-sectional view of a semiconductor laser device according to a fifth embodiment of the present invention.
Figure 6B:
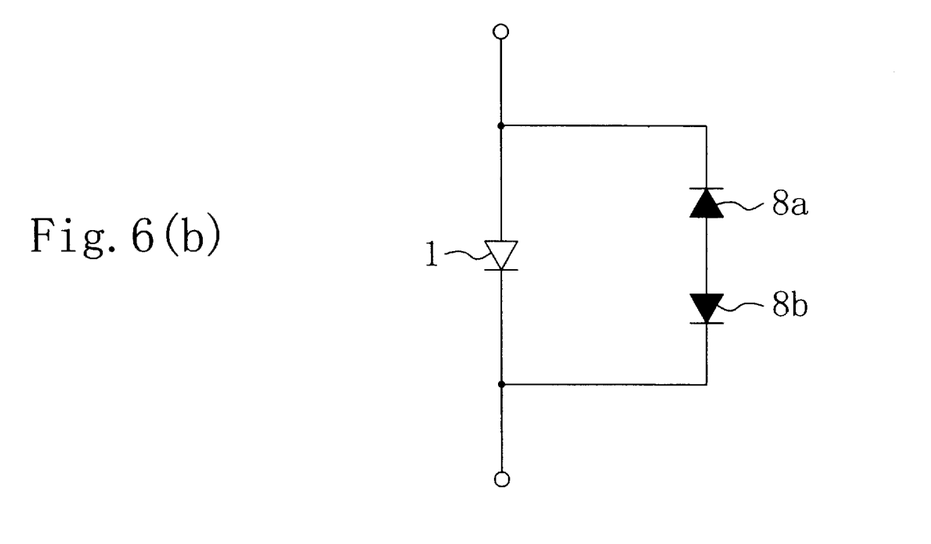
FIG. 6(b) is a circuit diagram of the semiconductor laser device of the fifth embodiment.

FIG. 6(a) is a cross-sectional view of a semiconductor laser device according to a fifth embodiment of the present invention; and FIG. 6(b) is a circuit diagram of the semiconductor laser device of the fifth embodiment.

As shown in FIG. 6(a), a semiconductor laser chip 1 is provided over a package 3 with a conductive laser mount 2 interposed therebetween. A semiconductor substrate 5, including first and second diodes 8a and 8b thereon, is also provided on the package 3.

As shown in FIG. 6(b), the anodes of the first and second diodes 8a and 8b are connected in common. The cathode of the first diode 8a is connected to the anode of the semiconductor laser chip 1. The cathode of the second diode 8b is connected to the cathode of the semiconductor laser chip 1.

In the fifth embodiment, when a surge voltage is applied to the semiconductor laser device, breakdown happens in the first diode 8a connected to the semiconductor laser chip 1 to have mutually reverse polarities. On the other hand, the second diode 8b, connected to the semiconductor laser chip 1 to have the same polarity, is forward biased. As a result, the surge current can be absorbed. In this case, by increasing the junction capacitance (or decreasing the impedance) of the first diode 8a, the surge current can be absorbed even more effectively.

Also, setting the avalanche voltage of the first diode 8a larger than the bias voltage of the semiconductor laser chip 1, if a surge voltage higher than the bias voltage has been applied, the surge current can be absorbed more effectively. In addition, even if a bias voltage varies or a reference voltage, applied to a laser driver, fluctuates due to the superposition of a radio frequency voltage, the bias voltage of the second diode 8b hardly changes, although the bias voltage of the first diode 8a does change. Thus, it is possible to prevent the modulated components from leaking from the laser chip into the diodes even if a radio frequency voltage has been superimposed, for example. Accordingly, when the semiconductor laser device is modulated with pulses, the waveform of a current flowing through the device and the intensity waveform of output optical power thereof exhibit excellent response at the rise and fall times of the pulses.

Embodiment 6

Figure 7A:
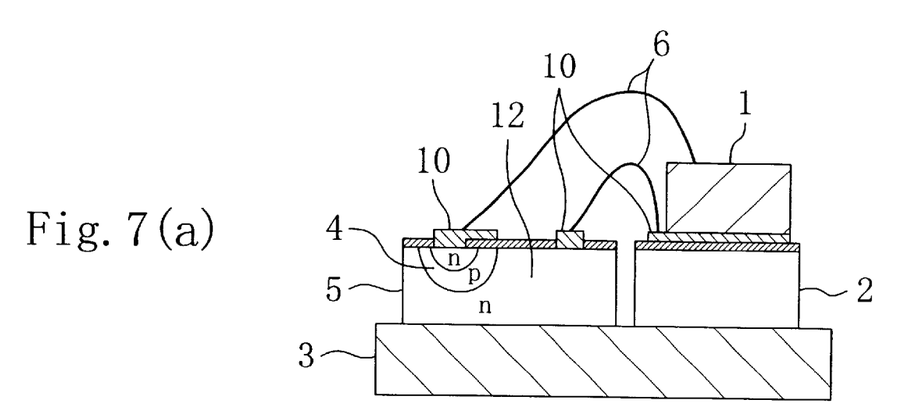
FIG. 7(a) is a cross-sectional view of a semiconductor laser device according to a sixth embodiment of the present invention.
Figure 7B:
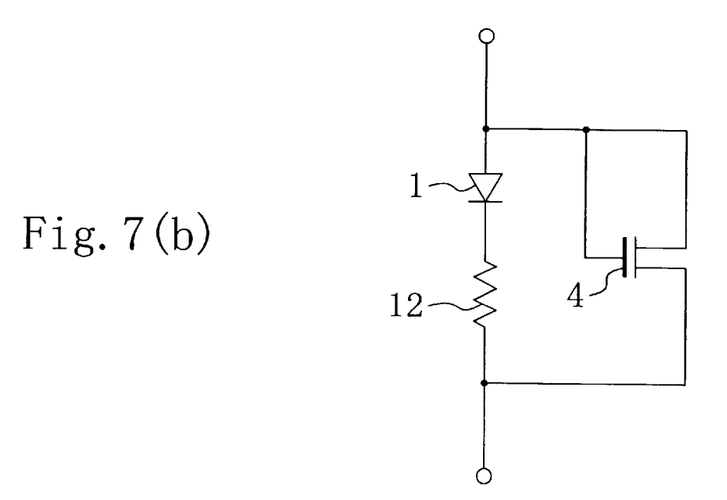
FIG. 7(b) is a circuit diagram of the semiconductor laser device of the sixth embodiment.

FIG. 7(a) is a cross-sectional view of a semiconductor laser device according to a sixth embodiment of the present invention; and FIG. 7(b) is a circuit diagram of the semiconductor laser device of the sixth embodiment.

As shown in FIG. 7(a), a semiconductor laser chip 1, made of GaAlAs, is provided over a package 3 with a conductive laser mount 2 interposed therebetween. A semiconductor substrate 5, including an n-channel field effect transistor 4 operating in an enhancement mode and a resistor 12 thereon, is also provided on the package 3. The semiconductor laser chip 1 is connected to the field effect transistor 4 and to the resistor 12 by connecting respective wires 6 to associated electrodes 10.

As shown in FIG. 7(b), the anode of the semiconductor laser chip 1 is connected to the gate and drain of the field effect transistor 4, while the cathode of the semiconductor laser chip 1 and the source of the field effect transistor 4 are connected to each other via the resistor 12.

The series resistance of the semiconductor laser chip 1, the resistance of the resistor 12 and the on-resistance between the drain and source of the field effect transistor 4 are set at 3Ω, 3Ω and 2Ω, respectively.

In this embodiment, the bias voltage of the semiconductor laser chip 1 is 2 V and the threshold voltage of the field effect transistor 4 is 4 V. When a surge voltage exceeding 4 V is applied to the semiconductor laser device, the field effect transistor 4 starts to operate because the voltage applied to the field effect transistor 4 exceeds the threshold voltage thereof, and a surge current flows through the field effect transistor 4. In this case, a surge current flows through a serial circuit in which the semiconductor laser chip 1 and the resistor 12 are connected in series to each other. The amount of the surge current is determined based on the ratio of the impedance of the serial circuit to the impedance of the field effect transistor 4. Thus, by increasing the resistance of the resistor 12, the surge current flowing through the semiconductor laser chip 1 can be reduced. In this configuration, even if the series resistance of the semiconductor laser chip 1 is fixed, the surge current flowing through the semiconductor laser chip 1 can be controlled only by regulating the impedance of the resistor 12 or the field effect transistor 4.

This sixth embodiment is implemented by modifying the first embodiment through the addition of the resistor 12 to the semiconductor laser chip 1 of the first embodiment. Such a modification is also applicable to the semiconductor laser device of any of the second through fifth embodiments and the same effects are attainable in any case.

As described above, the semiconductor laser device of the present invention includes an electronic device, such as the field effect transistor 4 or the bipolar transistor 7 for absorbing a surge current, on the laser mount 2 or on the semiconductor substrate 5. In this manner, the semiconductor laser device can absorb the surge current without increasing the number of components thereof.

In the embodiments of the present invention, the field effect transistor 4 may be a p-channel transistor, not the n-channel transistor exemplified above, and the bipolar transistor 7 may be a pnp transistor, not the npn transistor illustrated above.

The package applicable to the embodiments of the present invention may be of a gang-bonded type or a lead frame type. However, the shape and the material of the package are not especially limited.

The semiconductor laser chip may be made of a compound selected from the group consisting of: GaAlAs; InGaAlP; GaN; InGaN; AlGaN; ZnSe; ZnMgSSe; ZnCdSSe; InP; InGaAs; and InGaAsP.

In using a compound resulting in a short laser oscillation wavelength such as InGaAlP, GaN, InGaN or AlGaN, the energy of photons is high. Thus, when light is emitted from the semiconductor laser chip made of such a compound upon the application of a surge voltage thereto, the end facets of the semiconductor laser chip 1 are very likely to be optically damaged. According to the present invention, deterioration of a semiconductor chip due to the surge current can be suppressed. Thus, the present invention is particularly effective to semiconductor laser chips made of such compounds as resulting in a shorter laser oscillation wavelength.

What is claimed is:

1. A semiconductor laser device comprising:
   a semiconductor laser chip including: an anode, a cathode and an active layer, the semiconductor laser chip oscillating a laser beam from a light-emitting region of the active layer when an electric current flows from said anode to said cathode; and
   a field effect transistor having a source, drain, and gate, said anode of said semiconductor laser chip being connected to said drain of said field effect transistor, said gate of said field effect transistor being connected to said drain of said field effect transistor, and said cathode of said semiconductor laser chip being connected to said source of said field effect transistor;
   wherein an absolute value of a threshold voltage of said field effect transistor is larger than an absolute value of a bias voltage of said semiconductor laser chip so that when a voltage exceeding a threshold voltage of said field effect transistor is applied to said semiconductor laser chip, a surge current flows through and is absorbed by said field effect transistor.

2. The device of claim 1, wherein the absolute value of the threshold voltage of the field effect transistor is larger than the absolute value of the bias voltage of the semiconductor laser chip by 0.2 V to 5.0 V.

3. A semiconductor laser device comprising: a semiconductor laser chip including: an anode, a cathode and an active layer, the semiconductor laser chip oscillating a laser beam from a light-emitting region of the active layer when an electric current flows from said anode to said cathode; and
   a field effect transistor having a source, drain, and gate, said anode of said semiconductor laser chip being connected to said drain of said field effect transistor, said gate of said field effect transistor being connected to said drain of said field effect transistor, and said cathode of said semiconductor laser chip being connected to said source of said field effect transistor;
   wherein an absolute value of a threshold voltage of said field effect transistor is larger than an absolute value of a bias voltage of said semiconductor laser chip so that when a voltage exceeding a threshold voltage of said field effect transistor is applied to said semiconductor laser chip, a surge current flows through and is absorbed by said field effect transistor,
   wherein an on-resistance between the drain and the source of the field effect transistor is equal to or less than $5\Omega$.

4. A semiconductor laser device comprising:
   a semiconductor laser chip including: an anode, a cathode and an active layer, the semiconductor laser chip oscillating a laser beam from a light-emitting region of the active layer when an electric current flows from said anode to said cathode; and
   a bipolar transistor having a collector and an emitter, said anode of said semiconductor laser chip being connected to said collector of said bipolar transistor, and said cathode of said semiconductor laser chip being connected to said emitter of said bipolar transistor;
   wherein an absolute value of an avalanche voltage between said collector and said emitter of said bipolar transistor is larger than an absolute value of a bias voltage of said semiconductor laser chip so that when a voltage exceeding said avalanche voltage is applied to said semiconductor laser chip, a surge current flows through and is absorbed by said bipolar transistor.

5. The device of claim 4, wherein the absolute value of the avalanche voltage between the collector and the emitter of the bipolar transistor is larger than the absolute value of the bias voltage of the semiconductor laser chip by 0.2 V to 5.0 V.

6. A semiconductor laser device comprising:
   a semiconductor laser chip including: an anode, a cathode and an active layer, the semiconductor laser chip oscillating a laser beam from a light-emitting region of the active layer when an electric current flows from said anode to said cathode;
   a field effect transistor having a source, drain, and a gate, and
   a bipolar transistor having a collector, an emitter, and a base, said anode of said semiconductor laser chip being connected to said collector of said bipolar transistor, said cathode of said semiconductor laser chip being connected to said emitter of said bipolar transistor, said drain of said field effect transistor being connected to said collector of said bipolar transistor, said source of said field effect transistor being connected to said base of said bipolar transistor, and said gate of said field effect transistor being connected to said drain of said field effect transistor,
   wherein an absolute value of a threshold voltage of said field effect transistor is larger than an absolute value of a bias voltage of said semiconductor laser chip so that when a voltage exceeding a threshold voltage of said field effect transistor is applied to said semiconductor laser chip, a base current is injected into said bipolar transistor and a surge current flows through and is absorbed by said bipolar transistor.

7. The device of claim 6, wherein the absolute value of the threshold voltage of the field effect transistor is larger than the absolute value of the bias voltage of the semiconductor laser chip by 0.2 V to 5.0 V.

8. A semiconductor laser device comprising:

a semiconductor laser chip including: an anode, a cathode and an active layer, the semiconductor laser chip oscillating a laser beam from a light-emitting region of the active layer when an electric current flows from said anode to said cathode; and a surge absorber including a diode and a capacitor that are connected in series to each other, said anode of said semiconductor laser chip being connected to one terminal of said surge absorber, said cathode of said semiconductor laser chip being connected to the other terminal of said surge absorber, and said diode being connected to said semiconductor laser chip to have the same polarity;

wherein an impedance of said diode is larger than that of said semiconductor laser chip so that it is possible to prevent modulated components from leaking from said semiconductor laser chip into said surge absorber even if a radio frequency voltage is superimposed.

9. A semiconductor laser device comprising:

a semiconductor laser chip including a first anode, a first cathode and an active layer, the semiconductor laser chip oscillating a laser beam from a light-emitting region of the active layer when an electric current flows from the first anode to the first cathode;

a first diode having a second anode and a second cathode; and a second diode having a third anode and a third cathode, said second anode being connected to said third anode, said first anode being connected to said second cathode, and said first cathode being connected to said third cathode;

wherein an impedance of said first diode is larger than that of said semiconductor laser chip so that when a surge voltage is applied to said semiconductor laser device, break-down happens in said first diode connected to said semiconductor laser chip and said second diode is forward biased such that the surge current is absorbed.

10. The device of claim 9, wherein a difference between an absolute value of a reverse avalanche voltage of the first diode and an absolute value of a bias voltage of the semiconductor laser chip is larger than 0 V and equal to or smaller than 5 V.

* * * * *